(12) United States Patent
Hoshino

(10) Patent No.: US 10,809,618 B2
(45) Date of Patent: Oct. 20, 2020

(54) METHOD OF FORMING RESIST PATTERN

(71) Applicant: ZEON CORPORATION, Chiyoda-ku, Tokyo (JP)

(72) Inventor: Manabu Hoshino, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 182 days.

(21) Appl. No.: 16/060,514

(22) PCT Filed: Jan. 20, 2017

(86) PCT No.: PCT/JP2017/002029
§ 371 (c)(1),
(2) Date: Jun. 8, 2018

(87) PCT Pub. No.: WO2017/130872
PCT Pub. Date: Aug. 3, 2017

(65) Prior Publication Data
US 2019/0004425 A1 Jan. 3, 2019

(30) Foreign Application Priority Data

Jan. 29, 2016 (JP) ................................. 2016-016596

(51) Int. Cl.
G03F 7/039 (2006.01)
G03F 7/20 (2006.01)
G03F 7/32 (2006.01)
H01L 21/027 (2006.01)
G03F 7/004 (2006.01)

(52) U.S. Cl.
CPC ............ G03F 7/0392 (2013.01); G03F 7/039 (2013.01); G03F 7/20 (2013.01); G03F 7/32 (2013.01); G03F 7/325 (2013.01); H01L 21/027 (2013.01); G03F 7/0046 (2013.01)

(58) Field of Classification Search
CPC ....................................................... G03F 7/32
See application file for complete search history.

(56) References Cited

U.S. PATENT DOCUMENTS

| 5,759,986 | A | * | 6/1998 | Merchant | ................ | C08J 9/149 |
|  |  |  |  |  |  | 134/10 |
| 9,835,949 | B2 | * | 12/2017 | Jesorka | ..................... | G03F 7/32 |
| 2013/0078578 | A1 |  | 3/2013 | Iyama et al. |  |  |
| 2015/0008211 | A1 |  | 1/2015 | Takano et al. |  |  |

FOREIGN PATENT DOCUMENTS

| JP | S57118243 A | 7/1982 |
| JP | H083636 B2 | 1/1996 |
| WO | 2013145695 A1 | 10/2013 |

OTHER PUBLICATIONS

Sep. 13, 2019, the Extended European Search Report issued by the European Patent Office in the corresponding European Patent Application No. 17744102.9.
Apr. 18, 2017, International Search Report issued in the International Patent Application No. PCT/JP2017/002029.
Jul. 31, 2018, International Preliminary Report on Patentability issued in the International Patent Application No. PCT/JP2017/002029.

* cited by examiner

Primary Examiner — Kathleen Duda
(74) Attorney, Agent, or Firm — Kenja IP Law PC

(57) ABSTRACT

The objective is to favorably form a clear resist pattern using a resist composition containing a polymer that can inhibit resist pattern collapse when used as a main chain scission-type positive resist. A method of forming a resist pattern includes: a step of forming a resist film using a positive resist composition containing a polymer including a monomer unit (A) represented by general formula (I), shown below, and a monomer unit (B) represented by general formula (II), shown below, with a proviso that at least one of the monomer unit (A) and the monomer unit (B) includes at least one fluorine atom; an exposure step; and a development step. The development is carried out using a developer having a surface tension of 17 mN/m or less.

6 Claims, No Drawings

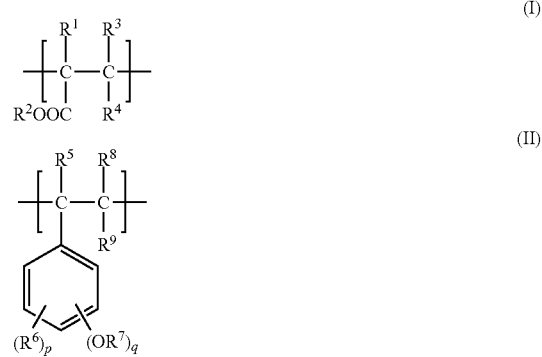

METHOD OF FORMING RESIST PATTERN

TECHNICAL FIELD

This disclosure relates to a method of forming a resist pattern and, in particular, to a method of forming a resist pattern using a positive resist composition containing a polymer that can suitably be used as a positive resist.

BACKGROUND

Polymers that display increased solubility in a developer after undergoing main chain scission through irradiation with ionizing radiation, such as an electron beam, or short-wavelength light, such as ultraviolet light, are conventionally used as main chain scission-type positive resists in fields such as semiconductor production. (Hereinafter, the term "ionizing radiation or the like" is used to refer collectively to ionizing radiation and short-wavelength light.)

PTL 1 discloses one example of a main chain scission-type positive resist having high sensitivity. The disclosed positive resist comprises an α-methylstyrene-methyl α-chloroacrylate copolymer that includes an α-methylstyrene unit and a methyl α-chloroacrylate unit.

The formation of a resist pattern using a resist film formed using a positive resist comprising an α-methylstyrene-methyl α-chloroacrylate copolymer utilizes the difference in rates of dissolution in developer of an exposed section that is irradiated with ionizing radiation or the like and a non-exposed section that is not irradiated with ionizing radiation or the like. Alkyl group-containing carboxylic acid ester solvents such as amyl acetate and hexyl acetate, for example, are widely used as developers (for example, refer to PTL 2).

CITATION LIST

Patent Literature

PTL 1: JP H8-3636 B
PTL 2: WO 2013/145695 A1

SUMMARY

Technical Problem

In a formation process of a resist pattern using a resist, resist pattern collapse may occur during formation of the resist pattern through irradiation with ionizing radiation or the like, development treatment using a developer, and rinse treatment using a rinsing liquid. Therefore, there is demand for the inhibition of resist pattern collapse in formation of a resist pattern using a resist.

However, it has not been possible to sufficiently inhibit resist pattern collapse through the positive resist comprising an α-methylstyrene-methyl α-chloroacrylate copolymer described in PTL 1.

Moreover, in formation of a resist pattern utilizing the difference in rates of dissolution in developer of exposed and non-exposed sections, it is necessary to increase solubility in developer of the exposed section while inhibiting dissolution in developer of the non-exposed section in order to favorably form a clear resist pattern. The solubility in developer of exposed and non-exposed sections in formation of a resist pattern using a main chain scission-type positive resist changes under the influence of properties of a polymer used as the positive resist and the type of developer.

Accordingly, there is demand for the development of a way of favorably forming a clear resist pattern using a resist composition containing a polymer that can inhibit resist pattern collapse when used as a main chain scission-type positive resist.

Solution to Problem

The inventor conducted diligent studies with the aim of achieving the objective described above. Through these studies, the inventor made a new discovery that resist pattern collapse can be inhibited when a main chain scission-type positive resist is formed using a positive resist composition that contains a specific polymer including at least one fluorine atom. However, upon further investigation, the inventor found that a resist formed using a positive resist composition containing the specific polymer has extremely high solubility in conventionally used alkyl group-containing carboxylic acid ester solvents such as previously described. Consequently, it was not possible to sufficiently increase the clarity of an obtained resist pattern when these solvents were used. The inventor made a new discovery that by using a developer having a surface tension that is not more than a specific value in development of a resist formed using a positive resist composition that contains a specific polymer including at least one fluorine atom, a clear resist pattern can be favorably formed while also sufficiently inhibiting resist pattern collapse, and thereby completed this disclosure.

Specifically, this disclosure aims to advantageously solve the problems set forth above by disclosing a method of forming a resist pattern comprising: forming a resist film using a positive resist composition containing a solvent and a polymer including a monomer unit (A) represented by general formula (I), shown below,

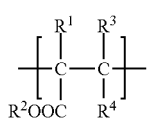
(I)

(in general formula (I), $R^1$ is a chlorine atom, a fluorine atom, or a fluorine atom-substituted alkyl group, $R^2$ is an unsubstituted alkyl group or a fluorine atom-substituted alkyl group, and $R^3$ and $R^4$ are each a hydrogen atom, a fluorine atom, an unsubstituted alkyl group, or a fluorine atom-substituted alkyl group and may be the same or different), and a monomer unit (B) represented by general formula (II), shown below,

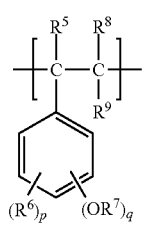
(II)

(in general formula (II), $R^5$, $R^6$, $R^8$, and $R^9$ are each a hydrogen atom, a fluorine atom, an unsubstituted alkyl group, or a fluorine atom-substituted alkyl group and may be the same or different, $R^7$ is a hydrogen atom, an unsubstituted alkyl group, or a fluorine atom-substituted alkyl group, p and q are each an integer of at least 0 and not more than 5, and p+q=5), with a proviso that at least one of the monomer unit (A) and the monomer unit (B) includes at least one fluorine atom; exposing the resist film; and developing the resist film that has been exposed, wherein the developing is carried out using a developer having a surface tension of 17 mN/m or less. By using a developer having a surface tension of 17 mN/m or less to develop a resist film formed using a positive resist composition containing a polymer that includes the specific monomer units (A) and (B), at least one of which includes at least one fluorine atom, resist pattern collapse can be sufficiently inhibited, and a clear resist pattern can be favorably formed.

Note that in a case in which p in formula (II) is 2 or more, the plurality of $R^6$ groups may be the same or different. Likewise, in a case in which q in formula (II) is 2 or more, the plurality of $R^7$ groups may be the same or different. Herein, the surface tension of a developer can be measured, for example, at 25° C. by the ring method.

In the presently disclosed method of forming a resist pattern, it is preferable that the developer comprises a fluorine-containing solvent. By using a fluorine-containing solvent in development of a resist film formed from the specific polymer described above, resist pattern collapse can be further inhibited, and the clarity of an obtained resist pattern can be further improved.

Moreover, in the presently disclosed method of forming a resist pattern, it is preferable that the developer is $CF_3CFHCFHCF_2CF_3$. By using $CF_3CFHCFHCF_2CF_3$ as the developer, resist pattern collapse can be even further inhibited, and the clarity of an obtained resist pattern can be even further improved.

Furthermore, in the presently disclosed method of forming a resist pattern, it is preferable that $R^1$ is a chlorine atom. When $R^1$ of the monomer unit (A) is a chlorine atom, main chain scission properties upon irradiation with ionizing radiation or the like can be further improved. Accordingly, a method of forming a resist pattern using a positive resist composition that contains the corresponding polymer enables further improvement of resist pattern clarity and improvement of sensitivity to an appropriate level. Moreover, general applicability of the method of forming a resist pattern can be increased because it is easy to produce a polymer for which $R^1$ of the monomer unit (A) is a chlorine atom.

Also, in the presently disclosed method of forming a resist pattern, it is preferable that $R^2$ is a fluorine atom-substituted alkyl group, and $R^3$ and $R^4$ are each a hydrogen atom or an unsubstituted alkyl group. When $R^2$ of the monomer unit (A) is a fluorine atom-substituted alkyl group, and $R^3$ and $R^4$ of the monomer unit (A) are each a hydrogen atom or an unsubstituted alkyl group, main chain scission properties upon irradiation with ionizing radiation or the like can be further improved. Accordingly, a method of forming a resist pattern using a positive resist composition that contains the corresponding polymer enables favorable formation of a resist pattern.

Moreover, in the presently disclosed method of forming a resist pattern, it is preferable that $R^5$ to $R^9$ are each a hydrogen atom or an unsubstituted alkyl group, and the monomer unit (A) includes at least one fluorine atom. A polymer for which $R^5$ to $R^9$ of the monomer unit (B) are each a hydrogen atom or an unsubstituted alkyl group, and for which the monomer unit (A) includes at least one fluorine atom is easy to produce and has excellent main chain scission properties upon irradiation with ionizing radiation or the like. Accordingly, a method of forming a resist pattern using a positive resist composition that contains the corresponding polymer enables favorable formation of a resist pattern.

Furthermore, in the presently disclosed method of forming a resist pattern, it is preferable that development time is at least 3 minutes and not more than 5 minutes. A development time of at least 3 minutes and not more than 5 minutes enables further improvement of the clarity of an obtained resist pattern.

Advantageous Effect

The presently disclosed method of forming a resist pattern enables favorable formation of a clear resist pattern.

DETAILED DESCRIPTION

The following provides a detailed description of embodiments of this disclosure.

A polymer contained in a resist composition used in the presently disclosed method of forming a resist pattern can be favorably used as a main chain scission-type positive resist that undergoes main chain scission to lower molecular weight upon irradiation with ionizing radiation, such as an electron beam, or short-wavelength light, such as ultraviolet light. The presently disclosed method of forming a resist pattern is a method that includes a step of developing a positive resist film containing the presently disclosed polymer using a specific developer and may be adopted for formation of a resist pattern in a production process of a printed board such as a build-up board.

Method of Forming Resist Pattern

The presently disclosed method of forming a resist pattern uses a positive resist composition described in detail below. Specifically, the presently disclosed method of forming a resist pattern includes a step of forming a resist film using a specific positive resist composition (resist film formation step), a step of exposing the resist film (exposure step), and a step of developing the resist film that has been exposed (development step). One feature of the presently disclosed method of forming a resist pattern is that the development step is carried out using a developer having a surface tension of 17 mN/m or less. Through use of a developer having a surface tension of 17 mN/m or less to develop a resist film containing a specific fluorine atom-containing polymer, the presently disclosed method of forming a resist pattern enables favorable formation of a clear resist pattern while also sufficiently inhibiting resist pattern collapse.

Resist Film Formation Step

In the resist film formation step, the positive resist composition is applied onto a workpiece, such as a substrate, that is to be processed using a resist pattern, and the applied positive resist composition is dried to form a resist film. The substrate is not specifically limited and may, for example, be a substrate including an insulating layer and copper foil on the insulating layer that is used in production of a printed board or the like. Moreover, no specific limitations are placed on the application method and the drying method of the positive resist composition, and any method that is typically used in formation of a resist film may be adopted.

The positive resist composition described below is used in the presently disclosed pattern formation method.

Positive Resist Composition

The positive resist composition contains a solvent and a specific fluorine atom-containing polymer (described in detail below), and may optionally further contain known additives that can be used in resist compositions.

Polymer

The polymer contained in the positive resist composition that is used in the presently disclosed method of forming a resist pattern includes: a monomer unit (A) represented by general formula (I), shown below,

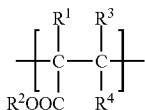

(in formula (I), $R^1$ is a chlorine atom, a fluorine atom, or a fluorine atom-substituted alkyl group, $R^2$ is an unsubstituted alkyl group or a fluorine atom-substituted alkyl group, and $R^3$ and $R^4$ are each a hydrogen atom, a fluorine atom, an unsubstituted alkyl group, or a fluorine atom-substituted alkyl group and may be the same or different); and a monomer unit (B) represented by general formula (II), shown below,

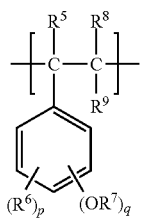

(in formula (II), $R^5$, $R^6$, $R^8$, and $R^9$ are each a hydrogen atom, a fluorine atom, an unsubstituted alkyl group, or a fluorine atom-substituted alkyl group and may be the same or different, $R^7$ is a hydrogen atom, an unsubstituted alkyl group, or a fluorine atom-substituted alkyl group, p and q are each an integer of at least 0 and not more than 5, and p+q=5). In the presently disclosed polymer, at least one of the monomer unit (A) and the monomer unit (B) includes at least one fluorine atom. In other words, the polymer contained in the resist composition that is used in the presently disclosed method of forming a resist pattern may be a polymer in which the monomer unit (A) includes at least one fluorine atom and the monomer unit (B) does not include a fluorine atom, a polymer in which the monomer unit (B) includes at least one fluorine atom and the monomer unit (A) does not include a fluorine atom, or a polymer in which the monomer unit (A) and the monomer unit (B) each include at least one fluorine atom.

Although the polymer may further contain any monomer unit other than the monomer unit (A) and the monomer unit (B), the proportion constituted by the monomer unit (A) and the monomer unit (B), in total, among all monomer units included in the polymer is preferably 90 mol % or more, and is preferably 100 mol % (i.e., the polymer preferably only includes the monomer unit (A) and the monomer unit (B)).

Through inclusion of the specific monomer units (A) and (B), the polymer can undergo main chain scission to lower molecular weight upon irradiation with ionizing radiation or the like (for example, an electron beam, KrF laser, ArF laser, or EUV laser). Moreover, as a result of at least one of the monomer unit (A) and the monomer unit (B) in the presently disclosed polymer including at least one fluorine atom, resist pattern collapse can be sufficiently inhibited when the polymer is used as a resist.

Although the reason that resist pattern collapse can be inhibited through inclusion of a fluorine atom in at least one of the monomer unit (A) and the monomer unit (B) is not clear, it is presumed that as a result of liquid repellency of the polymer being enhanced, it is possible to inhibit pulling that arises between pattern sections during removal of a developer or rinsing liquid in the resist pattern formation process.

Monomer Unit (A)

The monomer unit (A) is a structural unit that is derived from a monomer (a) represented by general formula (III), shown below.

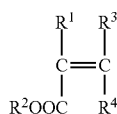

(In formula (III), $R^1$ to $R^4$ are the same as in formula (I).)

The proportion constituted by the monomer unit (A) among all monomer units included in the polymer is not specifically limited but may, for example, be set as at least 30 mol % and not more than 70 mol %.

Examples of fluorine atom-substituted alkyl groups that may form any of $R^1$ to $R^4$ in formulae (I) and (III) include, but are not specifically limited to, groups having a structure in which all or some of the hydrogen atoms of an alkyl group are substituted with fluorine atoms.

Examples of unsubstituted alkyl groups that may form any of $R^2$ to $R^4$ in formulae (I) and (III) include, but are not specifically limited to, unsubstituted alkyl groups having a carbon number of at least 1 and not more than 10. Of such alkyl groups, a methyl group or an ethyl group is preferable as an unsubstituted alkyl group that may form any of $R^2$ to $R^4$.

From a viewpoint of improving main chain scission properties of the polymer upon irradiation with ionizing radiation or the like, $R^1$ in formulae (I) and (III) is preferably a chlorine atom, a fluorine atom, or a fluorine atom-substituted alkyl group having a carbon number of at least 1 and not more than 5, more preferably a chlorine atom, a fluorine atom, or a perfluoromethyl group, even more preferably a chlorine atom or a fluorine atom, and particularly preferably a chlorine atom. In particular, a polymer for which $R^1$ is a chlorine atom has better main chain scission properties than a polymer for which $R^1$ is a fluorine atom when used as a main chain scission-type positive resist, can further improve resist pattern clarity, and can improve sensitivity to an appropriate level. Note that a case in which $R^1$ is a chlorine atom is also advantageous in terms that a monomer (a) for which $R^1$ in formula (III) is a chlorine atom has excellent polymerizability, and a polymer including a monomer unit (A) for which $R^1$ in formula (I) is a chlorine atom is easy to produce.

Moreover, from a viewpoint of improving main chain scission properties of the polymer upon irradiation with ionizing radiation or the like, $R^2$ in formulae (I) and (III) is preferably a fluorine atom-substituted alkyl group, more preferably a fluorine atom-substituted alkyl group having a carbon number of at least 1 and not more than 10, even more preferably a 2,2,2-trifluoroethyl group, a 2,2,3,3,3-pentafluoropropyl group, a 2-(perfluorobutyl)ethyl group, a 2-(perfluorohexyl)ethyl group, a 1H,1H,3H-tetrafluoropropyl group, a 1H,1H,5H-octafluoropentyl group, a 1H,1H,7H-dodecafluoroheptyl group, a 1H-1-(trifluoromethyl)trifluoroethyl group, a 1H,1H,3H-hexafluorobutyl group, or a 1,2,2,2-tetrafluoro-1-(trifluoromethyl)ethyl group, and is particularly preferably a 2,2,2-trifluoroethyl group.

Furthermore, from a viewpoint of improving main chain scission properties of the polymer upon irradiation with ionizing radiation or the like, $R^3$ and $R^4$ in formulae (I) and (III) are each preferably a hydrogen atom or an unsubstituted alkyl group, more preferably a hydrogen atom or an unsubstituted alkyl group having a carbon number of at least 1 and not more than 5, and even more preferably a hydrogen atom.

Examples of the monomer (a) represented by formula (III) described above that can form the monomer unit (A) represented by formula (I) described above include, but are not specifically limited to, fluoroalkyl esters of α-chloroacrylic acid such as 2,2,2-trifluoroethyl α-chloroacrylate, 2,2,3,3,3-pentafluoropropyl α-chloroacrylate, 2-(perfluorobutyl)ethyl α-chloroacrylate, 2-(perfluorohexyl)ethyl α-chloroacrylate, 1H,1H,3H-tetrafluoropropyl α-chloroacrylate, 1H,1H,5H-octafluoropentyl α-chloroacrylate, 1H,1H,7H-dodecafluoroheptyl α-chloroacrylate, 1H-1-(trifluoromethyl)trifluoroethyl α-chloroacrylate, 1H,1H,3H-hexafluorobutyl α-chloroacrylate, and 1,2,2,2-tetrafluoro-1-(trifluoromethyl)ethyl α-chloroacrylate; alkyl esters of α-fluoroacrylic acid such as methyl α-fluoroacrylate and ethyl α-fluoroacrylate; alkyl esters of α-fluoroalkylacrylic acids such as methyl α-trifluoromethylacrylate and ethyl α-trifluoromethylacrylate; and fluoroalkyl esters of α-fluoroacrylic acid such as 2,2,2-trifluoroethyl α-fluoroacrylate, 2,2,3,3,3-pentafluoropropyl α-fluoroacrylate, 2-(perfluorobutyl)ethyl α-fluoroacrylate, 2-(perfluorohexyl)ethyl α-fluoroacrylate, 1H,1H,3H-tetrafluoropropyl α-fluoroacrylate, 1H,1H,5H-octafluoropentyl α-fluoroacrylate, 1H,1H,7H-dodecafluoroheptyl α-fluoroacrylate, 1H-1-(trifluoromethyl)trifluoroethyl α-fluoroacrylate, 1H,1H,3H-hexafluorobutyl α-fluoroacrylate, and 1,2,2,2-tetrafluoro-1-(trifluoromethyl)ethyl α-fluoroacrylate.

From a viewpoint of further improving main chain scission properties of the polymer upon irradiation with ionizing radiation or the like, the monomer unit (A) is preferably a structural unit that is derived from a fluoroalkyl ester of α-chloroacrylic acid. In other words, it is particularly preferable that in formulae (I) and (III), $R^1$ is a chlorine atom, $R^2$ is a fluorine atom-substituted alkyl group, and $R^3$ and $R^4$ are each a hydrogen atom.

Monomer Unit (B)

The monomer unit (B) is a structural unit that is derived from a monomer (b) represented by general formula (IV), shown below.

(In formula (IV), $R^5$ to $R^9$, p, and q are the same as in formula (II).)

The proportion constituted by the monomer unit (B) among all monomer units included in the polymer is not specifically limited but may, for example, be set as at least 30 mol % and not more than 70 mol %.

Examples of fluorine atom-substituted alkyl groups that may form any of $R^5$ to $R^9$ in formulae (II) and (IV) include, but are not specifically limited to, groups having a structure in which all or some of the hydrogen atoms of an alkyl group are substituted with fluorine atoms.

Examples of unsubstituted alkyl groups that may form any of $R^5$ to $R^9$ in formulae (II) and (IV) include, but are not specifically limited to, unsubstituted alkyl groups having a carbon number of at least 1 and not more than 5. Of such alkyl groups, a methyl group or an ethyl group is preferable as an unsubstituted alkyl group that may form any of $R^5$ to $R^9$.

From a viewpoint of improving ease of production of the polymer and main chain scission properties of the polymer upon irradiation with ionizing radiation or the like, $R^5$ in formulae (II) and (IV) is preferably a hydrogen atom or an unsubstituted alkyl group, more preferably an unsubstituted alkyl group having a carbon number of at least 1 and not more than 5, and even more preferably a methyl group.

Moreover, from a viewpoint of improving ease of production of the polymer and main chain scission properties of the polymer upon irradiation with ionizing radiation or the like, the plurality of $R^6$ and/or $R^7$ groups that are present in formulae (II) and (IV) are each preferably a hydrogen atom or an unsubstituted alkyl group, more preferably a hydrogen atom or an unsubstituted alkyl group having a carbon number of at least 1 and not more than 5, and even more preferably a hydrogen atom.

Note that in formulae (II) and (IV), from a viewpoint of improving ease of production of the polymer and main chain scission properties of the polymer upon irradiation with ionizing radiation or the like, it is preferable that p is 5, q is 0, and the five $R^6$ groups are each a hydrogen atom or an unsubstituted alkyl group, more preferable that the five $R^6$ groups are each a hydrogen atom or an unsubstituted alkyl group having a carbon number of at least 1 and not more than 5, and even more preferable that the five $R^6$ groups are each a hydrogen atom.

On the other hand, from a viewpoint of further inhibiting resist pattern collapse, the plurality of $R^6$ and/or $R^7$ groups that are present in formulae (II) and (IV) preferably include a fluorine atom or a fluorine atom-substituted alkyl group, and more preferably include a fluorine atom or a fluorine atom-substituted alkyl group having a carbon number of at least 1 and not more than 5.

Furthermore, from a viewpoint of improving ease of production of the polymer and main chain scission properties of the polymer upon irradiation with ionizing radiation or the like, $R^8$ and $R^9$ in formulae (II) and (IV) are each preferably a hydrogen atom or an unsubstituted alkyl group, more preferably a hydrogen atom or an unsubstituted alkyl group having a carbon number of at least 1 and not more than 5, and even more preferably a hydrogen atom.

Examples of the monomer (b) represented by formula (IV) described above that may be used to form the monomer unit (B) represented by formula (II) described above include, but are not specifically limited to, α-methylstyrene and derivatives thereof such as (b-1) to (b-11), shown below.

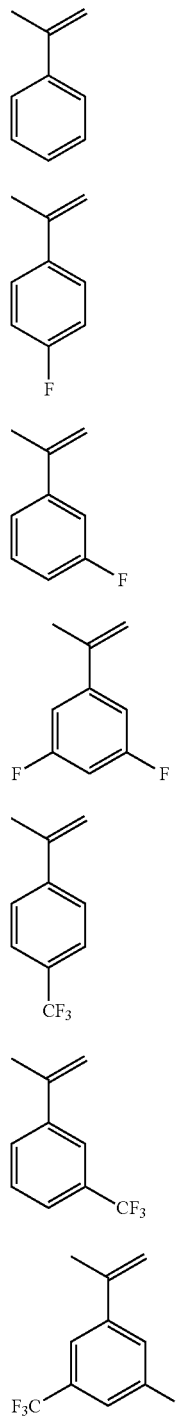

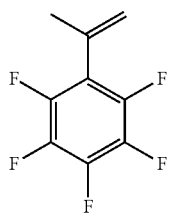

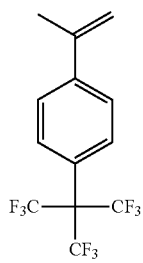

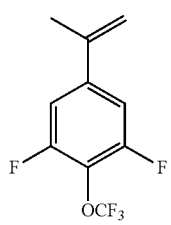

Note that from a viewpoint of improving ease of production of the polymer and main chain scission properties of the polymer upon irradiation with ionizing radiation or the like, the monomer unit (B) preferably does not include a fluorine atom (i.e., preferably only the monomer unit (A) includes a fluorine atom) and is more preferably a structural unit derived from α-methylstyrene. In other words, it is particularly preferable that in formulae (II) and (IV), p=5, q=0, $R^5$ is a methyl group, all five $R^6$ groups are hydrogen atoms, and $R^8$ and $R^9$ are each a hydrogen atom.

Weight Average Molecular Weight

The weight average molecular weight (Mw) of the polymer is preferably 22,000 or more, more preferably 25,000 or more, and even more preferably 55,000 or more, and is preferably 110,000 or less, more preferably 100,000 or less, and even more preferably 90,000 or less. When the weight average molecular weight (Mw) of the polymer is 22,000 or more, this increases the remaining film fraction of a resist film in a region that is not irradiated with ionizing radiation or the like (hereinafter, also referred to as a non-irradiated region) in a method of forming a resist pattern using a resist composition that contains the polymer, which can increase the γ value and further improve the clarity of an obtained resist pattern. Moreover, when the weight average molecular weight of the polymer is 22,000 or more, the elasticity of a positive resist formed using the polymer can be improved, and resist pattern collapse can be further inhibited. When the weight average molecular weight (Mw) of the polymer is 110,000 or less, the polymer is easy to produce. Moreover, when the weight average molecular weight (Mw) of the polymer is 110,000 or less, it is possible to improve sensitivity to an appropriate level in a method of forming a resist pattern using a resist composition that contains the polymer.

Herein, the "weight average molecular weight (Mw)" can be measured by gel permeation chromatography.

Number Average Molecular Weight

The number average molecular weight (Mn) of the polymer is preferably 15,000 or more, more preferably 20,000 or more, and even more preferably 35,000 or more. When the number average molecular weight (Mn) of the polymer is within any of the ranges set forth above, it is possible to further improve the γ value in a method of forming a resist pattern using a resist composition that contains the polymer.

Herein, the "number average molecular weight (Mn)" can be measured by gel permeation chromatography in the same way as the "weight average molecular weight (Mw)".

Molecular Weight Distribution

The molecular weight distribution (Mw/Mn) of the polymer is preferably less than 1.60, more preferably less than 1.45, and even more preferably less than 1.40, and is preferably 1.20 or more, more preferably 1.26 or more, and even more preferably 1.30 or more. When the molecular weight distribution (Mw/Mn) of the polymer is less than 1.60, it is possible to further increase the γ value and further increase the clarity of an obtained resist pattern in a method of forming a resist pattern using a resist composition that contains the polymer. Moreover, when the molecular weight distribution (Mw/Mn) of the polymer is 1.20 or more, the polymer is easier to produce. Furthermore, when the molecular weight distribution (Mw/Mn) is 1.20 or more in a case in which the weight average molecular weight of the polymer is 22,000 or more, the elasticity of a positive resist formed using the polymer can be further improved, and thus resist pattern collapse can be further inhibited.

Herein, "molecular weight distribution (Mw/Mn)" refers to the ratio of the weight average molecular weight (Mw) relative to the number average molecular weight (Mn).

Proportion of Components Having Molecular Weight of Less than 6,000

The proportion of components in the polymer having a molecular weight of less than 6,000 is preferably 6% or less, more preferably 2% or less, even more preferably 1% or less, particularly preferably 0.2% or less, and most preferably 0%. When the proportion of components having a molecular weight of less than 6,000 is 6% or less, it is possible to inhibit excessive film reduction under low irradiation with ionizing radiation or the like, further increase the γ value, and further increase the clarity of an obtained resist pattern in a method of forming a resist pattern using a resist composition that contains the polymer.

Proportion of Components Having Molecular Weight of Less Than 10,000

The proportion of components in the polymer having a molecular weight of less than 10,000 is preferably 15% or less, more preferably 2.7% or less, even more preferably 2% or less, and particularly preferably 1% or less. When the proportion of components having a molecular weight of less than 10,000 is 15% or less, it is possible to further increase the γ value and further increase the clarity of an obtained resist pattern in a method of forming a resist pattern using a resist composition that contains the polymer.

Proportion of Components Having Molecular Weight of More than 20,000

The proportion of components in the polymer having a molecular weight of more than 20,000 is preferably 60% or more, and more preferably 90% or more. When the proportion of components having a molecular weight of more than 20,000 is 60% or more, it is possible to increase the remaining film fraction in a non-irradiated region, and thereby increase the γ value and further increase the clarity of an obtained resist pattern in a method of forming a resist pattern using a resist composition that contains the polymer.

Proportion of Components Having Molecular Weight of More than 100,000

The proportion of components in the polymer having a molecular weight of more than 100,000 is preferably 40% or less. When the proportion of components having a molecular weight of more than 100,000 is 40% or less, the polymer is easy to produce. Moreover, sensitivity can be increased to an appropriate level in a method of forming a resist pattern using a resist composition that contains the polymer.

Production Method of Polymer

The polymer including the monomer unit (A) and the monomer unit (B) set forth above can be produced, for example, by carrying out polymerization of a monomer composition that contains the monomer (a) and the monomer (b), and then optionally purifying the obtained polymerized product.

The composition, molecular weight distribution, weight average molecular weight, and number average molecular weight of the polymer can be adjusted by altering the polymerization conditions and the purification conditions. In one specific example, the composition of the polymer can be adjusted by altering the percentage content of each monomer in the monomer composition used in polymerization. In another example, the weight average molecular weight and the number average molecular weight can be reduced by raising the polymerization temperature. In yet another example, the weight average molecular weight and the number average molecular weight can be reduced by shortening the polymerization time.

Polymerization of Monomer Composition

The monomer composition used in production of the polymer may be a mixture containing a monomer component that includes the monomer (a) and the monomer (b), an optionally useable solvent, a polymerization initiator, and optionally added additives. Polymerization of the monomer composition may be carried out by a known method. In a case in which a solvent is used, cyclopentanone or the like is preferable as the solvent. A radical polymerization initiator such as azobisisobutyronitrile is preferably used as the polymerization initiator. The weight average molecular weight and the number average molecular weight of the polymer can also be adjusted by altering the amount of the polymerization initiator. Specifically, the weight average molecular weight and the number average molecular weight can be increased by using a smaller amount of the polymerization initiator and, conversely, can be reduced by using a larger amount of the polymerization initiator. The weight average molecular weight and the number average molecular weight of the polymer can also be increased by reducing the amount of solvent in the monomer composition or by not using a monomer composition solvent.

The polymerized product obtained through polymerization of the monomer composition may be used as the polymer as-produced or may, without any specific limitations, be collected by adding a good solvent such as tetrahydrofuran to a solution containing the polymerized product and subsequently dripping the solution to which the good solvent has been added into a poor solvent such as methanol to coagulate the polymerized product, and then be purified as described below.

Purification of Polymerized Product

The method of purification in a case in which the obtained polymerized product is purified may be, but is not specifically limited to, a known purification method such as re-precipitation or column chromatography. Of these purification methods, purification by re-precipitation is preferable.

Note that purification of the polymerized product may be performed repeatedly.

Purification of the polymerized product by re-precipitation is, for example, preferably carried out by dissolving the resultant polymerized product in a good solvent such as tetrahydrofuran, and subsequently dripping the resultant solution into a mixed solvent of a good solvent, such as tetrahydrofuran, and a poor solvent, such as methanol, to precipitate a portion of the polymerized product. When purification of the polymerized product is carried out by dripping a solution of the polymerized product into a mixed solvent of a good solvent and a poor solvent as described above, the molecular weight distribution, weight average molecular weight, and number average molecular weight of the resultant polymer can easily be adjusted by altering the types and/or mixing ratio of the good solvent and the poor solvent. In one specific example, the molecular weight of polymer that precipitates in the mixed solvent can be increased by increasing the proportion of the good solvent in the mixed solvent.

Also note that in a situation in which the polymerized product is purified by re-precipitation, polymerized product that precipitates in the mixed solvent of the good solvent and the poor solvent may be used as the presently disclosed polymer, or polymerized product that does not precipitate in the mixed solvent (i.e., polymerized product dissolved in the mixed solvent) may be used as the presently disclosed polymer. Polymerized product that does not precipitate in the mixed solvent can be collected from the mixed solvent by a known technique such as concentration to dryness.

Solvent

The solvent may be any known solvent in which the above-described polymer is soluble. Of such solvents, anisole is preferable from a viewpoint of obtaining a positive resist composition of appropriate viscosity and improving coatability of the positive resist composition.

Exposure Step

In the exposure step, the resist film formed in the film formation step is irradiated with ionizing radiation or light to write a desired pattern.

Irradiation with ionizing radiation or light can be carried out using a known writing device such as an electron beam writer or a laser writer.

Development Step

In the development step, the resist film that has been exposed in the exposure step and a developer are brought into contact to develop the resist film and form a resist pattern on the workpiece.

The method by which the resist film and the developer are brought into contact may be, but is not specifically limited to, a method using a known technique such as immersion of the resist film in the developer or application of the developer onto the resist film.

Developer

The developer used in the presently disclosed method of forming a resist pattern is required to have a surface tension of 17 mN/m or less. The surface tension of the developer is preferably 16.5 mN/m or less, and more preferably 15 mN/m or less. As a result of the developer having a surface tension of 17 mN/m or less, the developer readily enters into fine gaps even when the development target is a fine resist pattern. The boiling point of the developer is preferably 63° C. or lower, and more preferably 60° C. or lower. A boiling point of 63° C. or lower facilitates drying.

The developer having a surface tension of 17 mN/m or less may, for example, be a fluorine-containing solvent such as $CF_3CFHCFHCF_2CF_3$, $CF_3CF_2CHCl_2$, $CClF_2CF_2CHClF$, $CF_3CF_2CF_2CF_2OCH_3$, $C_8F_{18}$, or a mixture thereof. Of these fluorine-containing solvents, $CF_3CFHCFHCF_2CF_3$ is preferable. In selection of a fluorine-containing solvent that can be used as the developer, it is preferable to select a fluorine-containing solvent that does not dissolve the resist film prior to implementation of the exposure step. So long as the surface tension as a developer is 17 mN/m or less, one solvent or a plurality of solvents other than solvents that themselves have a surface tension of 17 mN/m or less such as described above may be mixed and used. Examples of solvents that can be mixed include alcohols such as methanol, ethanol, 1-propanol, and 2-propanol (isopropyl alcohol); and alkyl group-containing esters of acetic acid such as amyl acetate and hexyl acetate. Through mixing of such solvents in which solubility of the resist film formed using the above-described polymer differs while ensuring that the surface tension of the overall developer is 17 mN/m or less, it is possible to achieve a good balance between ease of entry of the developer into fine gaps in a resist pattern and solubility of the resist pattern. In a case in which a mixture of a plurality of solvents including a fluorine-containing solvent is used as the developer, the proportion constituted by the fluorine-containing solvent among the overall developer is preferably more than 50 volume %, more preferably more than 75 volume %, even more preferably 90 volume % or more, and particularly preferably 95 volume % or more.

The rinsing liquid may be, but is not specifically limited to, a known rinsing liquid that is selected in accordance with the type of developer that is used. In selection of the rinsing liquid, it is preferable to select a rinsing liquid that readily mixes with the developer such as to facilitate substitution with the developer.

The temperature of the developer is not specifically limited and may, for example, be set as at least 21° C. and not higher than 25° C.

Development Conditions

The development conditions can be set as appropriate for obtaining a resist pattern of desired quality. For example, the development conditions may be determined such that the remaining film fraction at an irradiation dose of 0.85 Eth is 0.810 or more, and preferably 0.860 or more (hereinafter, also referred to as condition (i)). The following describes one example of a method of determining the development conditions.

First, conditions such as development time, developer concentration, and development temperature in formation of a resist pattern using a positive resist composition containing the specific polymer set forth above are provisionally set, and a sensitivity curve under these provisional conditions is prepared by a method described in the EXAMPLES section of the present specification. Next, the value of Eth for this sensitivity curve and the value of the remaining film fraction at an irradiation dose of 0.85 Eth are calculated by a method also described in the EXAMPLES section of the present specification. So long as condition (i) is satisfied, the provisional development conditions may be taken to be development conditions that can be adopted in the presently disclosed method of forming a resist pattern. However, in a case in which condition (i) is not satisfied under the provisional development conditions, the provisional development conditions are set once again, a sensitivity curve is prepared, and the value of the remaining film fraction at an irradiation dose of 0.85 Eth is calculated. Through repetition of this operation, it is possible to determine development conditions under which a resist pattern having high clarity can be formed when a positive resist composition containing a specific polymer is used.

In determination of the development conditions, it is preferable to adopt development conditions under which Eth is 140 µC/cm² or more, and it is preferable to adopt development conditions under which Eth is 280 µC/cm² or less.

As previously explained, in determination of the development conditions, it is preferable to adopt development conditions under which the remaining film fraction at an irradiation dose of 0.85 Eth is 0.810 or more, more preferable to adopt development conditions under which the remaining film fraction at an irradiation dose of 0.85 Eth is 0.860 or more, and even more preferable to adopt development conditions under which the remaining film fraction at an irradiation dose of 0.85 Eth is 0.870 or more. This is because resist pattern clarity can be further increased when the remaining film fraction at an irradiation dose of 0.85 Eth is 0.810 or more.

The development time can be determined as appropriate by the method of determining development conditions described above. Specifically, the development time may, for example, be set as at least 1 minute and not more than 30 minutes, at least 1 minute and not more than 20 minutes, at least 1 minute and not more than 10 minutes, at least 1 minute and not more than 5 minutes, at least 2 minutes and not more than 30 minutes, at least 2 minutes and not more than 20 minutes, at least 2 minutes and not more than 10 minutes, at least 2 minutes and not more than 5 minutes, at least 3 minutes and not more than 30 minutes, at least 3 minutes and not more than 20 minutes, at least 3 minutes and not more than 10 minutes, at least 3 minutes and not more than 5 minutes, or at least 3 minutes and not more than 4 minutes. Setting the development time as at least 3 minutes and not more than 5 minutes enables further improvement of the clarity of an obtained resist pattern.

EXAMPLES

The following provides a more specific description of this disclosure based on examples. However, this disclosure is not limited to the following examples. In the following description, "%" and "parts" used in expressing quantities are by mass, unless otherwise specified.

In examples and comparative examples, the following methods were used to measure and evaluate the weight average molecular weight, number average molecular weight, and molecular weight distribution of a polymer, the proportions of components in the polymer having various molecular weights, and the pattern collapse resistance, Eth, γ value, and remaining film fraction of a positive resist formed from the polymer.

Weight Average Molecular Weight, Number Average Molecular Weight, and Molecular Weight Distribution The weight average molecular weight (Mw) and number average molecular weight (Mn) of an obtained polymer were measured by gel permeation chromatography, and then the molecular weight distribution (Mw/Mn) of the polymer was calculated. Specifically, the weight average molecular weight (Mw) and number average molecular weight (Mn) of the polymer were determined as values in terms of standard polystyrene using a gel permeation chromatograph (HLC-8220 produced by Tosoh Corporation) with tetrahydrofuran as a developing solvent. The molecular weight distribution (Mw/Mn) was then calculated.

Proportions of Components in Polymer Having Various Molecular Weights

A chromatogram of the polymer was obtained using a gel permeation chromatograph (HLC-8220 produced by Tosoh Corporation) with tetrahydrofuran as a developing solvent. The total area (A) of all peaks and the total area (X) of peaks for components having a molecular weight within a specific range were determined from the obtained chromatogram. Specifically, the proportions of components having molecular weights within specific ranges defined by the following threshold values were calculated.

Proportion of components having molecular weight of less than 6,000(%)=($X_6$/A)×100

Proportion of components having molecular weight of less than 10,000(%)=($X_{10}$/A)×100

Proportion of components having molecular weight of more than 20,000(%)=($X_{20}$/A)×100

Proportion of components having molecular weight of more than 100,000(%)=($X_{100}$/A)×100

Example 1

Production of Polymer

A monomer composition containing 3.0 g of 2,2,2-trifluoroethyl α-chloroacrylate as monomer (a), 4.40 g of α-methylstyrene as monomer (b), 0.006975 g of azobisisobutyronitrile as a polymerization initiator, and 1.85 g of cyclopentanone as a solvent was added into a glass container. The glass container was tightly sealed and purged with nitrogen, and was then stirred for 6 hours in a 78° C. thermostatic tank under a nitrogen atmosphere. Thereafter, the glass container was returned to room temperature, the inside of the glass container was exposed to the atmosphere, and then 10 g of tetrahydrofuran (THF) was added to the resultant solution. The solution to which the THF had been added was then dripped into 300 g of methanol to precipitate a polymerized product. Thereafter, the solution containing the polymerized product that had been precipitated was filtered using a Kiriyama funnel to obtain a white coagulated material (polymerized product). The obtained polymerized product had a weight average molecular weight (Mw) of 50,883, a number average molecular weight (Mn) of 31,303, and a molecular weight distribution (Mw/Mn) of 1.63. Moreover, the obtained polymerized product comprised 50 mol % of 2,2,2-trifluoroethyl α-chloroacrylate units and 50 mol % of α-methylstyrene units.

Purification of Polymerized Product

Next, the obtained polymerized product was dissolved in 100 g of THF and the resultant solution was then dripped into a mixed solvent of 150 g of THF and 850 g of methanol (MeOH) to precipitate a white coagulated material (polymer including α-methylstyrene units and 2,2,2-trifluoroethyl α-chloroacrylate units). Thereafter, the solution containing the polymer that had been precipitated was filtered using a Kiriyama funnel to obtain a white polymer. The weight average molecular weight, number average molecular weight, and molecular weight distribution of the obtained polymer, and the proportions of components in the polymer having various molecular weights were measured. The results are shown in Table 1.

Production of Positive Resist Composition

The obtained polymer was dissolved in anisole used as a solvent to produce a resist solution (positive resist composition) in which the concentration of the polymer was 11 mass %. The pattern collapse resistance, γ value, Eth, and remaining film fraction of a positive resist film formed from the polymer were evaluated as described below. The results are shown in Table 1.

Pattern Collapse Resistance of Resist Film

A spin coater (MS-A150 produced by Mikasa Co., Ltd.) was used to apply the positive resist composition onto a silicon wafer of 4 inches in diameter. Next, the applied positive resist composition was heated for 3 minutes by a hot-plate at a temperature of 180° C. to form a resist film of 40 nm in thickness on the silicon wafer. An electron beam writing device (ELS-S50 produced by Elionix Inc.) was used to write a pattern through exposure of the resist film to an optimal exposure dose (Eop). Development treatment was subsequently carried out for 1 minute at a temperature of 23° C. using a fluorine-containing solvent having a surface tension of 14.1 mN/m (produced by Du Pont-Mitsui Fluorochemicals Co., Ltd.; Vertrel XF® (Vertrel XF is a registered trademark in Japan, other countries, or both); $CF_3CFHCFHCF_2CF_3$) as a resist developer and then rinsing was carried out for 10 seconds to form a resist pattern. The occurrence of pattern collapse of the formed resist pattern was inspected. Note that the optimal exposure dose (Eop) was set as appropriate with a value approximately double Eth as a rough guide. Lines (non-exposed regions) and spaces (exposed regions) of the resist pattern were each set as 20 nm.

Pattern collapse resistance was evaluated in accordance with the following standard.
A: Pattern collapse not observed
B: Pattern collapse observed γ Value of Resist Film A spin coater (MS-A150 produced by Mikasa Co., Ltd.) was used to apply the positive resist composition onto a silicon wafer of 4 inches in diameter such as to have a thickness of 500 nm. The applied positive resist composition was heated for 3 minutes by a hot-plate at a temperature of 180° C. to form a resist film on the silicon wafer. An electron beam writing device (ELS-S50 produced by Elionix Inc.) was used to write a plurality of patterns (dimensions: 500 μm×500 μm) over the resist film with different electron beam irradiation doses, development treatment was carried out for 1 minute at a temperature of 23° C. using a fluorine-containing solvent having a surface tension of 14.1 mN/m (produced by Du Pont-Mitsui Fluorochemicals Co., Ltd.; Vertrel XF®; $CF_3CFHCFHCF_2CF_3$) as a resist developer, and then rinsing was carried out for 10 seconds. The electron beam irradiation dose was varied in a range of 4 μC/cm² to 200 μC/cm² in increments of 4 μC/cm². Next, an optical film thickness meter (Lambda Ace produced by Dainippon Screen Mfg. Co., Ltd.) was used to measure the thickness of the resist film in regions in which writing had been performed. A sensitivity curve was prepared that indicated a relationship between the common logarithm of the total electron beam irradiation dose and the remaining film fraction of the resist film after development (=thickness of resist film after development/thickness of resist film formed on silicon wafer). The γ value was determined with respect to the obtained sensitivity curve (horizontal axis: common logarithm of total electron beam irradiation dose; vertical axis: remaining film fraction of resist film (0≤remaining film fraction 1.00)) by the following formula. In the following formula, $E_0$ is the logarithm of the total irradiation dose obtained when the sensitivity curve is fitted to a quadratic function in a range from a remaining film fraction of 0.20 to a remaining film fraction of 0.80, and then a remaining film fraction of 0 is substituted with respect to the obtained quadratic function (function of remaining film fraction and common logarithm of total irradiation dose). Also, $E_1$ is the logarithm of the total irradiation dose obtained when a straight line is prepared that joins points on the obtained quadratic function corresponding to remaining film fractions of 0 and 0.50 (linear approximation for gradient of sensitivity curve), and then a remaining film fraction of 1.00 is substituted with respect to the obtained straight line (function of remaining film fraction and common logarithm of total irradiation dose). The following formula expresses the gradient of the straight line between a remaining film fraction of 0 and a remaining film fraction of 1.00.

$$\gamma = \left| \log_{10}\left(\frac{E_1}{E_0}\right) \right|^{-1}$$

A larger γ value indicates that the sensitivity curve has a larger gradient and that a pattern having high clarity can be more favorably formed.

Eth

A resist film was formed on a silicon wafer in the same way as in the evaluation method for "γ Value of resist film". The initial thickness $T_0$ of the resultant resist film was measured using an optical film thickness meter (Lambda Ace produced by Dainippon Screen Mfg. Co., Ltd.). Moreover, the total electron beam irradiation dose Eth ($\mu C/cm^2$) was determined for a point at which the remaining film fraction was 0 on the straight line (linear approximation of sensitivity curve gradient) obtained in calculation of the γ value. A smaller value for Eth indicates higher resist film sensitivity and higher resist pattern formation efficiency.

Determination of Remaining Film Fraction

The electron beam irradiation doses used in preparation of the sensitivity curve, which were varied in a range of 4 $\mu C/cm^2$ to 200 $\mu C/cm^2$ in increments of 4 $\mu C/cm^2$ (i.e., 4, 8, 12, 16, . . . , 196, 200 $\mu C/cm^2$), were each divided by the value of Eth determined as described above.

In a case in which there was an electron beam irradiation dose for which the resultant value (electron beam irradiation dose/Eth) was 0.85, the remaining film fraction at that electron beam irradiation dose was taken to be the remaining film fraction (0.85 Eth).

In a case in which there was not an electron beam irradiation dose for which the resultant value (electron beam irradiation dose/Eth) was 0.85, two values closest to 0.85 among the resultant values were identified, and the electron beam irradiation doses at these two points were taken to be P ($\mu C/cm^2$) and P+4 ($\mu C/cm^2$). The remaining film fraction (0.85 Eth) was then determined by the following formula. The results are shown in Table 1.

Remaining film fraction (0.85 Eth)=$S-\{(S-T)/(V-U)\}\times(0.85-U)$

In this formula:
S represents the remaining film fraction at the electron beam irradiation dose P;
T represents the remaining film fraction at the electron beam irradiation dose P+4;
U represents P/Eth; and
V represents (P+4)/Eth.

A higher remaining film fraction at 0.85 Eth as calculated in this manner indicates that the resist film dissolves less readily in the developer at an irradiation dose that is lower than the total electron beam irradiation dose at which the remaining film fraction can be reduced to roughly 0. In other words, this indicates that in a peripheral region of a pattern formation region on a resist film, which is a region in which the irradiation dose is comparatively small, the resist film has low solubility in the developer. Accordingly, when the remaining film fraction calculated as described above is high, this indicates that there is a clear boundary between a region of the resist film that is to be dissolved to form a pattern and a region of the resist film that is to remain without being dissolved, and hence indicates high pattern clarity.

Example 2

A polymerized product was obtained in the same way as in Example 1 with the exception that the amount of azobisisobutyronitrile used as a polymerization initiator was changed to 0.005231 g and a solvent was not added. The obtained polymerized product had a weight average molecular weight (Mw) of 49,744, a number average molecular weight (Mn) of 30,184, and a molecular weight distribution (Mw/Mn) of 1.65. The obtained polymerized product comprised 50 mol % of 2,2,2-trifluoroethyl α-chloroacrylate units and 50 mol % of α-methylstyrene units.

A polymer was obtained in the same way as in Example 1 with the exception that the obtained solution was dripped into a mixed solvent of 200 g of THF and 800 g of methanol (MeOH) in purification of the polymerized product. The weight average molecular weight, number average molecular weight, and molecular weight distribution of the obtained polymer, and the proportions of components in the polymer having various molecular weights were measured in the same way as in Example 1. The results are shown in Table 1. Moreover, a positive resist composition was produced, and measurements and evaluations were carried out in the same way as in Example 1. The results are shown in Table 1.

Example 3

A polymerized product was obtained in the same way as in Example 1 with the exception that the amount of azobisisobutyronitrile used as a polymerization initiator was changed to 0.069751 g and the amount of cyclopentanone used as a solvent was changed to 1.87 g. The obtained polymerized product had a weight average molecular weight (Mw) of 21,807, a number average molecular weight (Mn) of 14,715, and a molecular weight distribution (Mw/Mn) of 1.48. The obtained polymerized product comprised 50 mol % of 2,2,2-trifluoroethyl α-chloroacrylate units and 50 mol % of α-methylstyrene units.

A polymer was obtained in the same way as in Example 1 with the exception that the obtained solution was dripped into a mixed solvent of 100 g of THF and 900 g of methanol (MeOH) in purification of the polymerized product. The weight average molecular weight, number average molecular weight, and molecular weight distribution of the obtained polymer, and the proportions of components in the polymer having various molecular weights were measured in the same way as in Example 1. The results are shown in Table 1. Moreover, a positive resist composition was produced, and measurements and evaluations were carried out in the same way as in Example 1. The results are shown in Table 1.

Example 4

A polymerized product was produced in the same way as in Example 1. The obtained polymerized product was not purified and was dissolved in anisole as a solvent to produce a resist solution (positive resist composition) in which the concentration of the polymerized product was 11 mass %. Measurements and evaluations were carried out in the same way as in Example 1. The results are shown in Table 1.

Example 5

A polymerized product was produced in the same way as in Example 3. The obtained polymerized product was not purified and was dissolved in anisole as a solvent to produce a resist solution (positive resist composition) in which the concentration of the polymerized product was 11 mass %. Measurements and evaluations were carried out in the same way as in Example 3. The results are shown in Table 1.

Comparative Example 1

The pattern collapse resistance, Eth, γ value, and remaining film fraction of a positive resist film were evaluated in the same way as in Example 1 with the exception that in formation of a resist film using the positive resist composition produced in Example 1, the developer that was used was changed to hexyl acetate having a surface tension of 27.3 mN/m (ZED-N60 produced by Zeon Corporation; containing impurities unavoidably mixed in during production). The results are shown in Table 1. In the present example, it was not possible to form a pattern due to excessive dissolution of the formed resist film in the developer. Although not shown in Table 1, in cases in which amyl acetate, heptyl acetate, octyl acetate, nonyl acetate, and decyl acetate, which each have a surface tension of more than 17 mN/m, were used as the developer, it was not possible to form a pattern due to excessive dissolution of the formed resist film in the developer in the same way as in Comparative Example 1. Accordingly, the same evaluation results as in Comparative Example 1 were obtained in these cases.

Examples 6 to 12

Measurements and evaluations were carried out in the same way as in Example 1 with the exception that in formation of a resist film using the positive resist composition produced in Example 1, the development treatment time (development time) was changed to 2 minutes, 3 minutes, 4 minutes, 5 minutes, 10 minutes, 20 minutes, and 30 minutes in Examples 6 to 12, respectively. The results are shown in Table 2.

Examples 13 to 19

Measurements and evaluations were carried out in the same way as in Example 2 with the exception that in formation of a resist film using the positive resist composition produced in Example 2, the development treatment time (development time) was changed to 2 minutes, 3 minutes, 4 minutes, 5 minutes, 10 minutes, 20 minutes, and 30 minutes in Examples 13 to 19, respectively. The results are shown in Table 3.

Examples 20 to 26

Measurements and evaluations were carried out in the same way as in Example 3 with the exception that in formation of a resist film using the positive resist composition produced in Example 3, the development treatment time (development time) was changed to 2 minutes, 3 minutes, 4 minutes, 5 minutes, 10 minutes, 20 minutes, and 30 minutes in Examples 20 to 26, respectively The results are shown in Table 4.

TABLE 1

| | | Example 1 | Example 2 | Example 3 | Example 4 | Example 5 | Comparative Example 1 |
|---|---|---|---|---|---|---|---|
| Polymer | Weight average molecular weight (Mw) [-] | 64383 | 94802 | 28458 | 50883 | 21807 | 64383 |
| | Number average molecular weight (Mn) [-] | 46824 | 68847 | 22858 | 31303 | 14715 | 46824 |
| | Molecular weight distribution (Mw/Mn) [-] | 1.38 | 1.38 | 1.26 | 1.63 | 1.48 | 1.38 |
| | Proportion of components having molecular weight of less than 6,000 [%] | 0.00 | 0.00 | 0.23 | 0.23 | 6.51 | 0.00 |
| | Proportion of components having molecular weight of less than 10,000 [%] | 0.30 | 0.00 | 2.64 | 2.49 | 19.44 | 0.30 |
| | Proportion of components having molecular weight of more than 20,000 [%] | 94.88 | 98.79 | 62.32 | 80.61 | 37.87 | 94.88 |
| | Proportion of components having molecular weight of more than 100,000 [%] | 14.26 | 36.09 | 0.61 | 9.02 | 0.36 | 14.26 |
| Development | Type of developer | Fluorine-containing solvent | Fluorine-containing solvent | Fluorine-containing solvent | Fluorine-containing solvent | Fluorine-containing solvent | Hexyl acetate |
| | Developer surface tension [mN/m] | 14.1 | 14.1 | 14.1 | 14.1 | 14.1 | 27.3 |
| | Development time [minutes] | 1 | 1 | 1 | 1 | 1 | 1 |
| Evaluation | Pattern collapse resistance | A | A | A | A | A | Pattern formation not possible |
| | Eth [mc/cm$^2$] | 274.0 | 273.9 | 249.8 | 274.2 | 224.9 | Not measurable |
| | γ Value [-] | 52.158 | 53.962 | 47.450 | 40.977 | 37.234 | Not measurable |
| | 0.85Eth remaining film fraction | 0.874 | 0.918 | 0.881 | 0.845 | 0.812 | 0 |

TABLE 2

| | | Example 6 | Example 7 | Example 8 | Example 9 | Example 10 | Example 11 | Example 12 |
|---|---|---|---|---|---|---|---|---|
| Polymer | Weight average molecular weight (Mw) [-] | 64383 | 64383 | 64383 | 64383 | 64383 | 64383 | 64383 |
| | Number average molecular weight (Mn) [-] | 46824 | 46824 | 46824 | 46824 | 46824 | 46824 | 46824 |
| | Molecular weight | 1.38 | 1.38 | 1.38 | 1.38 | 1.38 | 1.38 | 1.38 |

TABLE 2-continued

|  |  | Example 6 | Example 7 | Example 8 | Example 9 | Example 10 | Example 11 | Example 12 |
|---|---|---|---|---|---|---|---|---|
|  | distribution (Mw/Mn) [—] |  |  |  |  |  |  |  |
|  | Proportion of components having molecular weight of less than 6,000 [%] | 0.00 | 0.00 | 0.00 | 0.00 | 0.00 | 0.00 | 0.00 |
|  | Proportion of components having molecular weight of less than 10,000 [%] | 0.30 | 0.30 | 0.30 | 0.30 | 0.30 | 0.30 | 0.30 |
|  | Proportion of components having molecular weight of more than 20,000 [%] | 94.88 | 94.88 | 94.88 | 94.88 | 94.88 | 94.88 | 94.88 |
|  | Proportion of components having molecular weight of more than 100,000 [%] | 14.26 | 14.26 | 14.26 | 14.26 | 14.26 | 14.26 | 14.26 |
| Development | Type of developer | Fluorine-containing solvent | Fluorine-containing solvent | Fluorine-containing solvent | Fluorine-containing solvent | Fluorine-containing solvent | Fluorine-containing solvent | Fluorine-containing solvent |
|  | Developer surface tension [mN/m] | 14.1 | 14.1 | 14.1 | 14.1 | 14.1 | 14.1 | 14.1 |
|  | Development time [minutes] | 2 | 3 | 4 | 5 | 10 | 20 | 30 |
| Evaluation | Pattern collapse resistance | A | A | A | A | A | A | A |
|  | Eth [mc/cm$^2$] | 237.0 | 216.7 | 204.6 | 196.7 | 180.7 | 160.7 | 152.7 |
|  | γ Value [—] | 58.095 | 67.986 | 71.671 | 66.185 | 51.836 | 49.783 | 48.129 |
|  | 0.85Eth remaining film fraction | 0.886 | 0.934 | 0.933 | 0.920 | 0.912 | 0.921 | 0.925 |

TABLE 3

|  |  | Example 13 | Example 14 | Example 15 | Example 16 | Example 17 | Example 18 | Example 19 |
|---|---|---|---|---|---|---|---|---|
| Polymer | Weight average molecular weight (Mw) [—] | 94802 | 94802 | 94802 | 94802 | 94802 | 94802 | 94802 |
|  | Number average molecular weight (Mn) [—] | 68847 | 68847 | 68847 | 68847 | 68847 | 68847 | 68847 |
|  | Molecular weight distrbution (Mw/Mn) [—] | 1.38 | 1.38 | 1.38 | 1.38 | 1.38 | 1.38 | 1.38 |
|  | Proportion of components having molecular weight of less than 6,000 [%] | 0.00 | 0.00 | 0.00 | 0.00 | 0.00 | 0.00 | 0.00 |
|  | Proportion of components having molecular weight of less than 10,000 [%] | 0.00 | 0.00 | 0.00 | 0.00 | 0.00 | 0.00 | 0.00 |
|  | Proportion of components having molecular weight of more than 20,000 [%] | 98.79 | 98.79 | 98.79 | 98.79 | 98.79 | 98.79 | 98.79 |
|  | Proportion of components having molecular weight of more than 100,000 [%] | 36.09 | 36.09 | 36.09 | 36.09 | 36.09 | 36.09 | 36.09 |
| Development | Type of developer | Fluorine-containing solvent | Fluorine-containing solvent | Fluorine-containing solvent | Fluorine-containing solvent | Fluorine-containing solvent | Fluorine-containing solvent | Fluorine-containing solvent |
|  | Developer surface tension [mN/m] | 14.1 | 14.1 | 14.1 | 14.1 | 14.1 | 14.1 | 14.1 |
|  | Development time [minutes] | 2 | 3 | 4 | 5 | 10 | 20 | 30 |
| Evaluation | Pattern collapse resistance | A | A | A | A | A | A | A |
|  | Eth [mc/cm$^2$] | 249.3 | 228.7 | 220.6 | 208.6 | 189.2 | 173.7 | 158.2 |
|  | γ Value [—] | 52.868 | 63.060 | 61.618 | 59.619 | 43.830 | 41.544 | 42.739 |
|  | 0.85Eth remaining film fraction | 0.881 | 0.890 | 0.912 | 0.921 | 0.911 | 0.915 | 0.937 |

TABLE 4

|  |  | Example 20 | Example 21 | Example 22 | Example 23 | Example 24 | Example 25 | Example 26 |
|---|---|---|---|---|---|---|---|---|
| Polymer | Weight average molecular weight (Mw) [—] | 28458 | 28458 | 28458 | 28458 | 28458 | 28458 | 28458 |
|  | Number average molecular weight (Mn) [—] | 22858 | 22858 | 22858 | 22858 | 22858 | 22858 | 22858 |
|  | Molecular weight distribution (Mw/Mn) [—] | 1.26 | 1.26 | 1.26 | 1.26 | 1.26 | 1.26 | 1.26 |
|  | Proportion of components | 0.23 | 0.23 | 0.23 | 0.23 | 0.23 | 0.23 | 0.23 |

TABLE 4-continued

|  |  | Example 20 | Example 21 | Example 22 | Example 23 | Example 24 | Example 25 | Example 26 |
|---|---|---|---|---|---|---|---|---|
|  | having molecular weight of less than 6,000 [%] |  |  |  |  |  |  |  |
|  | Proportion of components having molecular weight of less than 10,000 [%] | 2.64 | 2.64 | 2.64 | 2.64 | 2.64 | 2.64 | 2.64 |
|  | Proportion of components having molecular weight of more than 20,000 [%] | 62.32 | 62.32 | 62.32 | 62.32 | 62.32 | 62.32 | 62.32 |
|  | Proportion of components having molecular weight of more than 100,000 [%] | 0.61 | 0.61 | 0.61 | 0.61 | 0.61 | 0.61 | 0.61 |
| Development | Type of developer | Fluorine-containing solvent | Fluorine-containing solvent | Fluorine-containing solvent | Fluorine-containing solvent | Fluorine-containing solvent | Fluorine-containing solvent | Fluorine-containing solvent |
|  | Developer surface tension [mN/m] | 14.1 | 14.1 | 14.1 | 14.1 | 14.1 | 14.1 | 14.1 |
|  | Development time [minutes] | 2 | 3 | 4 | 5 | 10 | 20 | 30 |
| Evaluation | Pattern collapse resistance | A | A | A | A | A | A | A |
|  | Eth [mc/cm$^2$] | 221.8 | 201.4 | 196.7 | 184.7 | 164.8 | 152.7 | 144.7 |
|  | γ Value [—] | 42.995 | 56.043 | 56.131 | 53.502 | 45.632 | 44.914 | 41.795 |
|  | 0.85Eth remaining film fraction | 0.882 | 0.905 | 0.901 | 0.892 | 0.886 | 0.887 | 0.915 |

From Tables 1 to 4, shown above, it can be seen that excellent pattern collapse resistance is achieved when a resist film formed using a positive resist composition that contains a specific fluorine atom-containing polymer is developed using a developer having a surface tension of 17 mN/m or less. Moreover, it can be seen that in resist pattern formation methods according to the examples, it is possible to increase the γ value and favorably form a resist pattern having high clarity.

INDUSTRIAL APPLICABILITY

The presently disclosed method of forming a resist pattern enables favorable formation of a clear resist pattern.

The invention claimed is:

1. A method of forming a resist pattern comprising:

forming a resist film using a positive resist composition containing a solvent and a polymer including a monomer unit (A) represented by general formula (I), shown below,

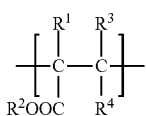
(I)

where, in general formula (I), $R^1$ is a chlorine atom, a fluorine atom, or a fluorine atom-substituted alkyl group, $R^2$ is an unsubstituted alkyl group or a fluorine atom-substituted alkyl group, and $R^3$ and $R^4$ are each a hydrogen atom, a fluorine atom, an unsubstituted alkyl group, or a fluorine atom-substituted alkyl group and may be the same or different, and a monomer unit (B) represented by general formula (II), shown below,

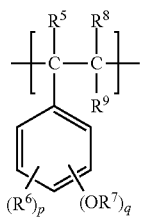
(II)

where, in general formula (II), $R^5$, $R^6$, $R^8$, and $R^9$ are each a hydrogen atom, a fluorine atom, an unsubstituted alkyl group, or a fluorine atom-substituted alkyl group and may be the same or different, $R^7$ is a hydrogen atom, an unsubstituted alkyl group, or a fluorine atom-substituted alkyl group, p and q are each an integer of at least 0 and not more than 5, and p+q=5, with a proviso that at least one of the monomer unit (A) and the monomer unit (B) includes at least one fluorine atom;

exposing the resist film; and developing the resist film that has been exposed, wherein the developing is carried out using a developer having a surface tension of 17 mN/m or less, and wherein the developer comprises a fluorine-containing solvent.

2. The method of forming a resist pattern according to claim 1, wherein the developer is $CF_3CFHCFHCF_2CF_3$.

3. The method of forming a resist pattern according to claim 1, wherein $R^1$ is a chlorine atom.

4. The method of forming a resist pattern according to claim 3, wherein $R^2$ is a fluorine atom-substituted alkyl group, and $R^3$ and $R^4$ are each a hydrogen atom or an unsubstituted alkyl group.

5. The method of forming a resist pattern according to claim 1, wherein $R^5$ to $R^9$ are each a hydrogen atom or an unsubstituted alkyl group, and the monomer unit (A) includes at least one fluorine atom.

6. The method of forming a resist pattern according to claim 1, wherein development time is at least 3 minutes and not more than 5 minutes.

\* \* \* \* \*